United States Patent
Kwon et al.

(10) Patent No.: US 7,054,215 B2
(45) Date of Patent: May 30, 2006

(54) MULTISTAGE PARALLEL-TO-SERIAL CONVERSION OF READ DATA IN MEMORIES, WITH THE FIRST SERIAL BIT SKIPPING AT LEAST ONE STAGE

(75) Inventors: Kook-Hwan Kwon, San Jose, CA (US); Steve S. Eaton, San Jose, CA (US)

(73) Assignee: ProMOS Technologies Pte. Ltd. (SG)

( * ) Notice: Subject to any disclaimer, the term of this patent is extended or adjusted under 35 U.S.C. 154(b) by 237 days.

(21) Appl. No.: 10/816,727

(22) Filed: Apr. 2, 2004

(65) Prior Publication Data

US 2005/0219888 A1    Oct. 6, 2005

(51) Int. Cl.
G11C 7/00 (2006.01)

(52) U.S. Cl. .............. 365/220; 365/194; 365/233; 365/189.01; 365/230.08

(58) Field of Classification Search ............... 365/220, 365/194, 233, 189.01, 230.08
See application file for complete search history.

(56) References Cited

U.S. PATENT DOCUMENTS

| | | | |
|---|---|---|---|
| 6,011,737 A | 1/2000 | Li et al. | |
| 6,115,321 A | 9/2000 | Koelling et al. | |
| 6,285,578 B1 | 9/2001 | Huang | |
| 6,549,444 B1 * | 4/2003 | Kyung et al. ............... | 365/63 |
| 6,563,747 B1 | 5/2003 | Faue | |
| 6,597,630 B1 | 7/2003 | Kubo et al. | |
| 6,600,691 B1 | 7/2003 | Morzano et al. | |
| 6,621,747 B1 | 9/2003 | Faue | |
| 6,882,579 B1 * | 4/2005 | Keeth et al. ............. | 365/189.03 |
| 6,909,643 B1 * | 6/2005 | Kwean ...................... | 365/193 |
| 6,914,829 B1 * | 7/2005 | Lee ......................... | 365/189.02 |
| 2002/0149960 A1 | 10/2002 | Yoo et al. | |
| 2003/0026161 A1 | 2/2003 | Yamaguchi et al. | |

OTHER PUBLICATIONS

JEDEC Standard: DDR2 SDRAM Specification: JESD79-2A, Jan. 2004, JEDEC Solid State Technology Association.
Preliminary Data Sheet: 1G bits DDR2 SDRAM: EDE1104AASE (256M words ×4 bits): EDE1108AASE (128M words × 8bits); Elpida Memory, Inc. 2003.
Davis, Brian; Mudge, Trevor; Jacob, Bruce; Cuppu, Vinodh "DDR2 and Low Latency Variants" Electrical Engineering and Computer Science, University of Michigan, Ann Arbor; Electrical & Computer Engineering, University of Maryland, College Park, pp. 1-15.

(Continued)

*Primary Examiner*—Richard Elms
*Assistant Examiner*—Toan Le
(74) *Attorney, Agent, or Firm*—Michael Shenker; MacPherson Kwok Chen & Heid LLP

(57) ABSTRACT

Data bits are prefetched from memory cells in parallel and are read out serially. The memory includes multiple stages (1710) of latches through which the parallel data is transferred before being read out serially. The multiple stages provide suitable delays to satisfy variable latency requirements (e.g. CAS latency in DDR2). The first bit for the serial output bypasses the last stage (1710.M). In some embodiments, the control signals controlling the stages other than the last stage in their providing the first data bit to the memory output are not functions of the control signals controlling the last stage providing the subsequent data bits to the memory output.

21 Claims, 14 Drawing Sheets

OTHER PUBLICATIONS

HYS64T32000GDL (256 Mbyte): HYS64R64020GDL (512 Mbyte) DDR2 Small Outline DIMM Modules; Data Sheet, vol. 82, Oct. 2003, Infineon Technologies.

Preliminary Data Sheet: 512 M bits DDR SDRAM: EDD5104ABTA (128M words × 4 bits): EDD5108ABTA (64M words × 8 bits); Elpida Memory, Inc. 2002-2003.

JEDEC Standard: Double Data Rate (DDR) SDRAM Specification: JESD79D, Jan. 2004, JEDEC Solid State Technology Association.

U.S. Appl. No. 10/794,782, entitled "Data Sorting in Memories," filed Mar. 3, 2004.

* cited by examiner

MULTISTAGE PARALLEL-TO-SERIAL CONVERSION OF READ DATA IN MEMORIES, WITH THE FIRST SERIAL BIT SKIPPING AT LEAST ONE STAGE

BACKGROUND OF THE INVENTION

The present invention relates to memories, and in particular to memory read operations.

To increase the read operation bandwidth, multiple data items can be prefetched in parallel from a memory array for a serial output. For example, in DDR2 (double date rate 2) synchronous dynamic random access memories (DRAMs), four data bits are prefetched in parallel for a serial output on the rising and falling edges of a clock signal in a burst read operation. DDR2 is defined in the DDR2 standard JESD79-2A (JEDEC Solid State Technology Association, January 2004) incorporated herein by reference. The DDR2 memory is pipelined, and the next read command can be issued to the memory before completion of the data output for the previous read command. Therefore, care must be taken to ensure that the prefetched data does not overwrite the data from the previous prefetch operation. Further, the DDR2 specification requires the memory to provide a variable, user-programmable latency ("CAS latency") defined as a latency between the receipt of the read command and the start of the serial data output. See FIG. 1 showing the data timing for the CAS latency ("CL") values 2, 3, 4, and 5 and a burst length of 4 for three read commands Ra, Rb, Rc issued on the rising edge of respective clock cycles 0, 2, and 4. Terminal DQ is an output terminal (actually an input/output terminal). The read data D0–D3 are marked as "A DATA" for command Ra, "B DATA" for command Rb, and "C DATA" for command Rc. The data are driven on the DQ terminal beginning in cycle 2 for CL=2, beginning in cycle 3 for CL=3, beginning in cycle 4 for CL=4, and beginning in cycle 5 for CL=5. (The data can actually be driven slightly earlier to ensure that the data are valid on the rising edge of the respective CLK cycle.) The programmable CAS latency requirement complicates the data output pipeline.

U.S. Pat. No. 6,600,691 B2 issued Jul. 29, 2003 to Morzano et al. describes a data output pipeline circuit with two stages, each stage having four latches for the respective four prefetched data bits. The four bits are written in parallel to the first stage, and from the first stage to the second stage. Then the data are converted to the serial format and written out to the output terminal. Control signals are generated to control the two stages and the parallel-to-serial conversion to provide the required timing for different CAS latencies and ensure that the subsequent data do not overwrite the previous data.

SUMMARY

This section summarizes some features of the invention. Other features are described in the subsequent sections. The invention is defined by the appended claims which are incorporated into this section by reference.

In some embodiments of the present invention, the memory includes two stages of latches as in the aforementioned U.S. Pat. No. 6,600,691, but some of the prefetched bits do not go through all the stages. The first bit for the serial output bypasses the second stage. Therefore, the first bit's data path is shortened, allowing increased memory speeds.

In some embodiments, the control signals that control providing the first data bit to the memory output by the first stage are not functions of the control signals that control providing the subsequent data bits to the memory output by the second stage.

In some embodiments, the first stage includes additional latches to receive the next prefetched data while the first stage still holds the previous prefetched data.

In some embodiments, the memory provides both DDR2 and DDR functionality. DDR is double data rate memory with a prefetch of two data items. See JEDEC Standard JESD79D, JEDEC Solid State Technology Association, January 2004, incorporated herein by reference.

The invention is not limited to DDR2 or DDR memories, a prefetch of four bits, or to other features described above. Additional features are described below. The invention is defined by the appended claims.

DESCRIPTION OF SOME EMBODIMENTS

The embodiments described in this section illustrate but do not limit the invention. The invention is not limited to particular circuitry, memory size or number of I/O terminals, and other details. The invention is defined by the appended claims.

Figure 2:
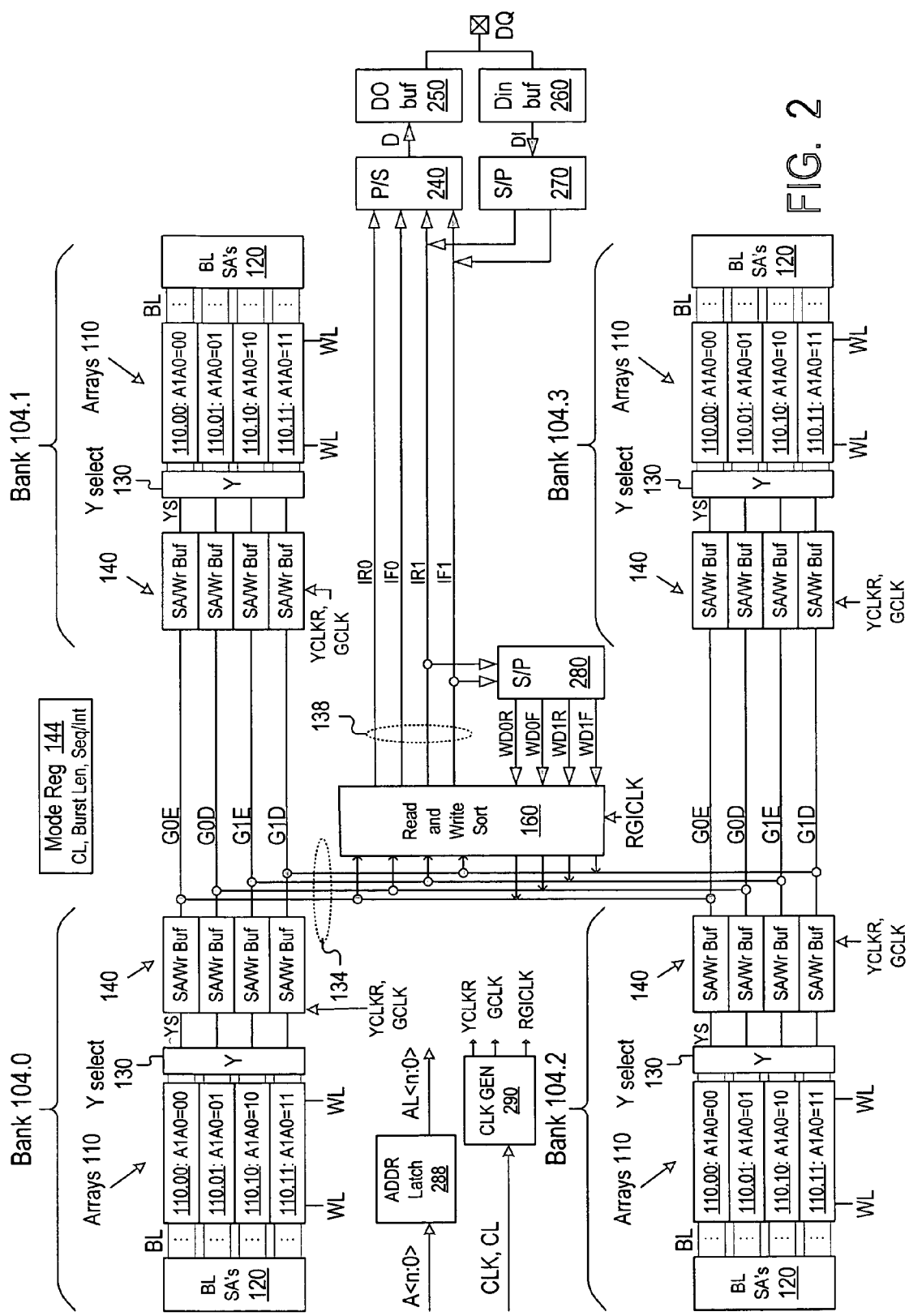
FIG. 2 is a block diagram of a memory according to one embodiment of the present invention.

FIG. 2 is a block diagram of a memory with a prefetch of four data items as specified in the DDR2 standard JESD79-2A (JEDEC Solid State Technology Association, January 2004) incorporated herein by reference. The memory has four banks 104.0–104.3. Each bank has four memory arrays 110.00, 110.01, 110.10. 110.11. A number of bitlines BL run horizontally through each array in the column direction, and a number of wordlines WL run vertically in the row direction. Each wordline runs through all the arrays of a memory bank. A memory address An . . . A2A1A0 (or A<n:0>) has a number of bits for selecting a memory bank 104, a number of bits for selecting a row (these bits form a row address), and a number of bits for selecting a column ("column address"). One bank 104 is selected by the address signals in each read operation. Bits A1A0 are the two least significant bits (LSBs) of the column address. Arrays 110.00 hold memory locations with A1A0=00, arrays 110.01 hold memory locations with A1A0=01, arrays 110.10 hold memory locations with A1A0=10, arrays 110.11 hold memory locations with A1A0=11. In the read operations, the wordlines WL are driven by row address decoders (not shown) as known in the art. Bitline sense amplifiers 120 amplify the signals on the bitlines. See e.g. U.S. Pat. No. 6,011,737 issued Jan. 4, 2000 to Li et al. and incorporated herein by reference. Y select circuit 130 selects a number of bitlines from each array corresponding to the column address. The data selected by Y select 130 are written in parallel, in a prefetch operation, to G-lines 134, also marked as lines G0E, G0D, G1E, G1D. From the G-lines, the data are transferred in parallel to I-lines 138 (also marked as IR0, IF0, IR1, IF1), and then serially to the input/output terminal DQ, as described in more detail below.

Y select circuit 130 consists of a number of pass transistors (not shown) each of which couples a bitline BL to a line YS when the transistor is on. FIG. 2 shows only one external data terminal DQ, and each Y select circuit selects a single bit of data (e.g. a single bitline or a pair of bitlines depending on the memory architecture) from each array 110.*ij* (i.e. each array 110.00, 110.01, 110.10, 110.11) of the selected bank. If the memory has a number of DQ terminals (e.g. 4, 8, or 16 terminals as in the DDR2 standard), then each Y select circuit will select a data item of 4, 8, 16, or some other number of bits from each array 110.*ij*, one bit being selected for each DQ terminal.

The YS lines can be connected to the respective G-lines 134 directly or through secondary sense amplifiers in blocks 140. Each block 140 includes sense amplifier and write buffer circuitry for one of the arrays 110.00–110.11. The memory includes four G lines G0E, G0D, G1E, G1D for each data terminal DQ. Line G0E carries data to and from the arrays 110.00 of all the memory banks. Line G0D carries data to and from the arrays 110.01. Line G1E carries data to and from the arrays 110.10. Line G1D carries data to and from the arrays 110.11. If the memory has some number N of data terminals, then the same number N of G-lines can be provided for the arrays 110.00, N G-lines for the arrays 110.01, N G-lines for the arrays 110.10, and N G-lines for the arrays 110.11. For example, if N=16, there can be sixteen lines G0E<0:15> for arrays 110.00, sixteen lines G0D<0:15> for arrays 110.01, and so on.

Figure 1:
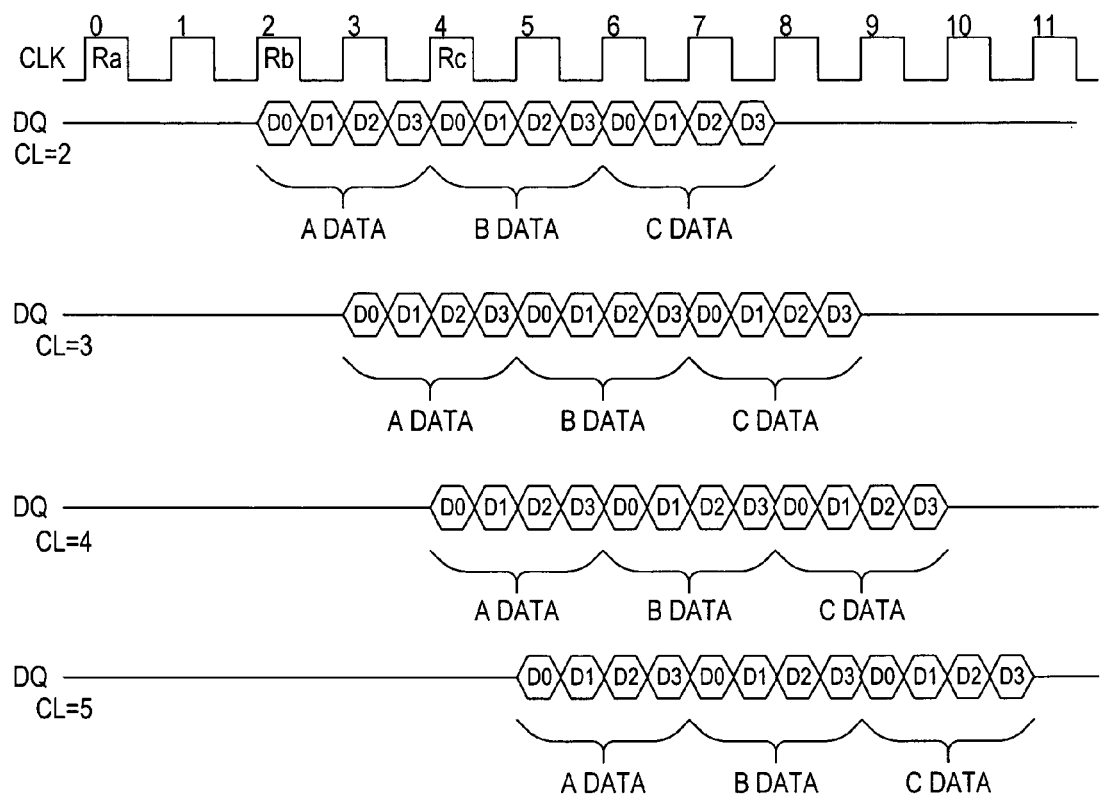
FIG. 1 is a data output timing diagram according to the JEDEC DDR2 standard cited above.

The DDR and DDR2 standards each specify a number of different data sequences for read and write operations. The data sequence, i.e. the order in which the data appear on the I/O terminal DQ, depends on the read or write starting address bits A2A1A0, the data ordering type (sequential or interleaved), and the burst length (2, 4 or 8). The data sequences are described in the Addendum at the end of this description, before the claims. The DDR data sequences are shown in Table 1 of the Addendum, and the DDR2 data sequences in Table 2. The burst length, the ordering type, and the CAS latency ("CL") are written to mode register 144 before the read operation. During the read operation, sorting circuit 160 sorts the data on G-lines 134 in accordance with Table 2 and drives the lines IR0, IF0, IR1, IF1 with the respective first, second, third, and fourth data bits to be output on the DQ terminal. The data bit on line IR0 (clock cycle 0, rising edge) will be driven on terminal DQ on the rising edge of the first data output clock cycle ("cycle 0"). In FIG. 1, "cycle 0" corresponds to cycle 2 for CL=2, to cycle 3 for CL=3, to cycle 4 for CL=4, and to cycle 5 for CL=5. The data bit on line IF0 (clock cycle 0, falling edge) will be driven on terminal DQ on the falling edge of the same clock cycle. The data bit on line IR1 (clock cycle 1, rising edge) will be driven on terminal DQ on the rising edge of the next clock cycle ("cycle 1"), and the data bit on line IF1 (clock cycle 1, falling edge) will be driven on terminal DQ on the falling edge of this clock cycle. Parallel to serial converter 240 converts the parallel data on the I-lines to the serial format in the order IR0, IF0, IR1, IF1, and provides the serial data its output node D. Data output buffer 250 converts the data signals on node D to suitable voltage and current levels and provides the data on terminal DQ in the two consecutive clock cycles (e.g. cycles 2 and 3 in FIG. 1 for CL=2).

For the burst length of 8, the steps described above are repeated, and four more data items are transferred to terminal DQ from lines IR0, IF0, IR1, IF1, in that order, so that 8 data items are output in 4 consecutive clock cycles.

I-lines 138 can also carry the write data. In the embodiment of FIG. 2, only two I-lines are used for the write data. These I-lines are IR1, IF1, but any two I-lines can be chosen. Alternatively, only one I-line can be used for the write data, or all the four I-lines can be used. It is also possible not to use the I-lines for the write data. The scheme of FIG. 2 (using exactly two I-lines) is believed to provide power and timing advantages. The write data is received serially on terminal DQ and latched and amplified by data input buffer 260. Serial-to-parallel converter 270 provides two data items received in one clock cycle to respective lines IR1 (rising edge data), IF1 (falling edge data). S/P converter 280 performs a 2:4 data conversion, and provides the data in parallel on respective lines WD0R, WD0F, WD1R, WD1F. Sorting circuit 160 transfers these data to lines G0E, G0D, G1E, G1D in parallel in accordance with Table 2. Write buffers in blocks 140 and Y select circuits 130 write the data to the memory cells in parallel.

Address latching circuit 288 latches the input addresses. Clock signal CLK is an external clock that clocks the memory operation. Clock generation circuit 290 generates various clock signals described below from the external clock CLK. Other memory features are described in U.S. patent application Ser. No. 10/794,782 "DATA SORTING IN MEMORIES" filed on Mar. 3, 2004 by J. Faue et al. and incorporated herein by reference.

In some embodiments, to insure a fast address-to-data timing and simplify the timing signals generation, the timing from the receipt of a read command to driving the data on I-lines 138 is the same for all the CAS latencies. In some embodiments, this timing is set to provide the read data on the I-lines as soon as possible after the read command. The timing adjustments for the different CAS latencies are performed by P/S converter 240. (These timing features do not limit the invention however.)

Figure 3:
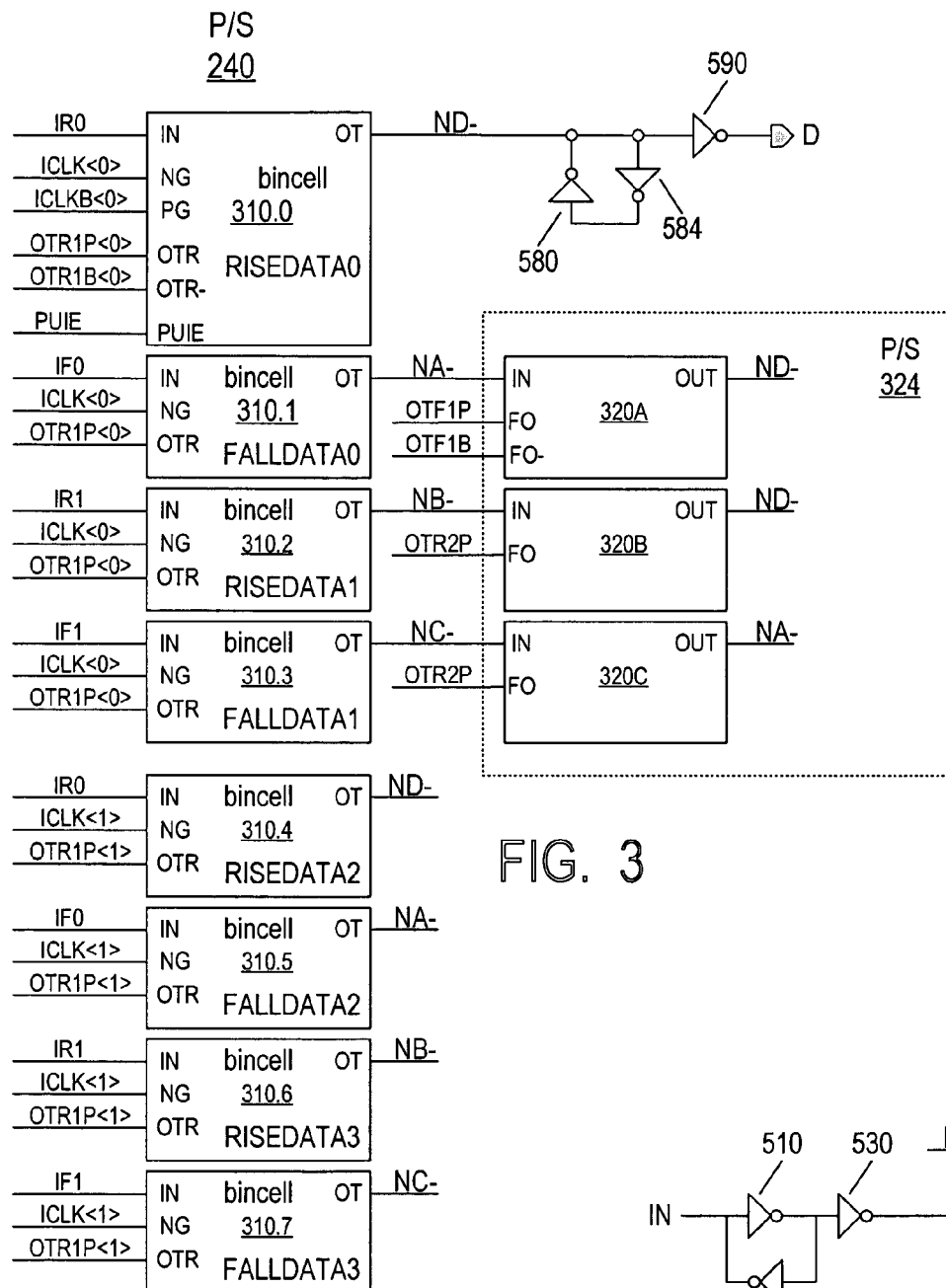
FIG. 3 is a block-circuit diagram of a memory circuit according to one embodiment of the present invention.

FIG. 3 is a block-circuit diagram of P/S converter 240. Two stages of latches are provided. The first stage consists of eight storage "bincells" (or "bins") 310.0–310.7. The second stage consists of latch circuits 320A, 320B, 320C. The second stage performs the parallel-to-serial conversion for the last three bits of data in each four-bit prefetch, so the second stage is marked as "P/S 324".

Figure 5:
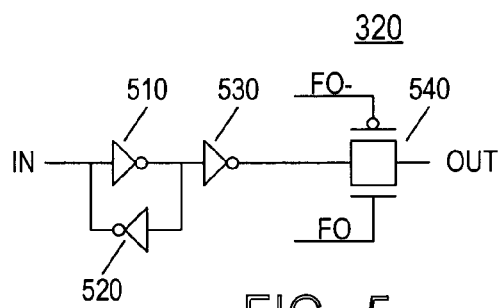
FIGS. 4 and 5 are circuit diagrams of memory circuits according to some embodiments of the present invention.
Figure 4:
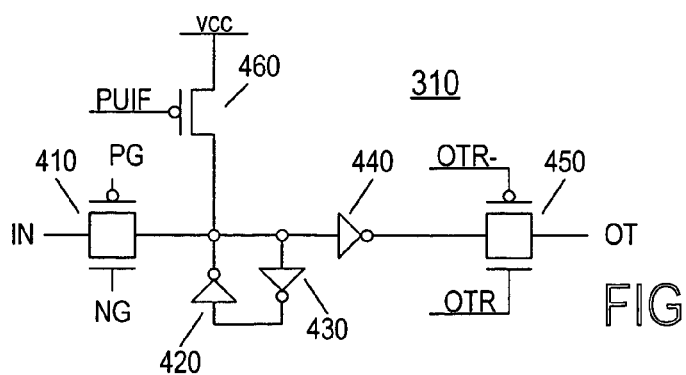

All circuits 310.0–310.7 are identical, and a circuit diagram of one such circuit 310 is shown in FIG. 4. All circuits 320A–320C are identical, and a circuit diagram of one such circuit 320 is shown in FIG. 5.

In each circuit 310, input IN is connected to one of I-lines IR0, IF0, IR1, IF1. Input IN is connected to one source/drain terminal of a pass gate 410. A pass gate consists of an NMOS transistor and a PMOS transistor connected in parallel. The PMOS gate of pass gate 410 is connected to an input PG. The NMOS gate of pass gate 410 is connected to an input NG. The input PG is not shown for bins 310.1–310.7 in FIG. 3. This input always receives the logic complement of the signal on input NG.

The other source/drain terminal of pass gate 410 is connected to a latch consisting of two cross-coupled inverters 420, 430. (For the sake of illustration, we will assume that all the circuitry is CMOS in this embodiment, though this is not necessary.) This latch temporarily stores a read data bit received from the respective I-line. This source/drain terminal of pass gate 410 is also connected to an input of inverter 440 whose output is connected to one source/drain terminal of pass gate 450. The other source/drain terminal of pass gate 450 is an output terminal OT of bin 310. The NMOS and PMOS gates of pass gate 450 receive respective input signals OTR, OTR−. These are always complementary signals, and only the input OTR is shown for bins 310.1–310.7 in FIG. 3.

PMOS transistor 460, controlled by an input signal PUIE, is connected between a power supply voltage VCC and the input of inverter 440 to pull the inverter input high on power-up. Transistor 460 is off during normal operation (signal PUIE is high). Input PUIE is not shown for bins 310.1–310.7 in FIG. 3.

When input NG becomes high, the data bit on the input IN is loaded into bin 310 and latched by inverters 420, 430. When OTR becomes high, the data bit is driven on output OT (in a complement form due to inverter 440). The signals on inputs OTR, OTR− are described below, and in some embodiments these signals are not functions of the signals on inputs FO, FO− of circuits 320.

Figure 6A:
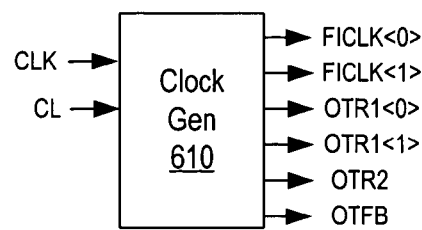
FIG. 6A is a block diagram of a memory circuit according to one embodiment of the present invention.
Figure 6B:
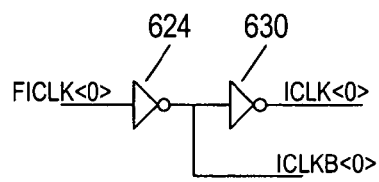
FIGS. 6B–6G are circuit diagrams of memory circuits according to some embodiments of the present invention.
Figure 6E:
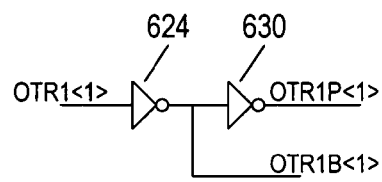
Figure 6C:
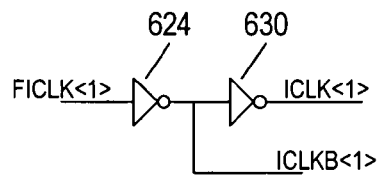
Figure 6F:
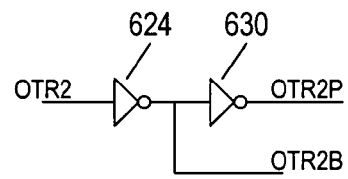
Figure 6D:
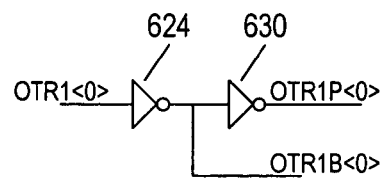
Figure 6G:
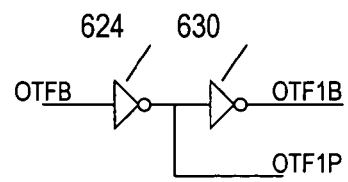
Figure 7:
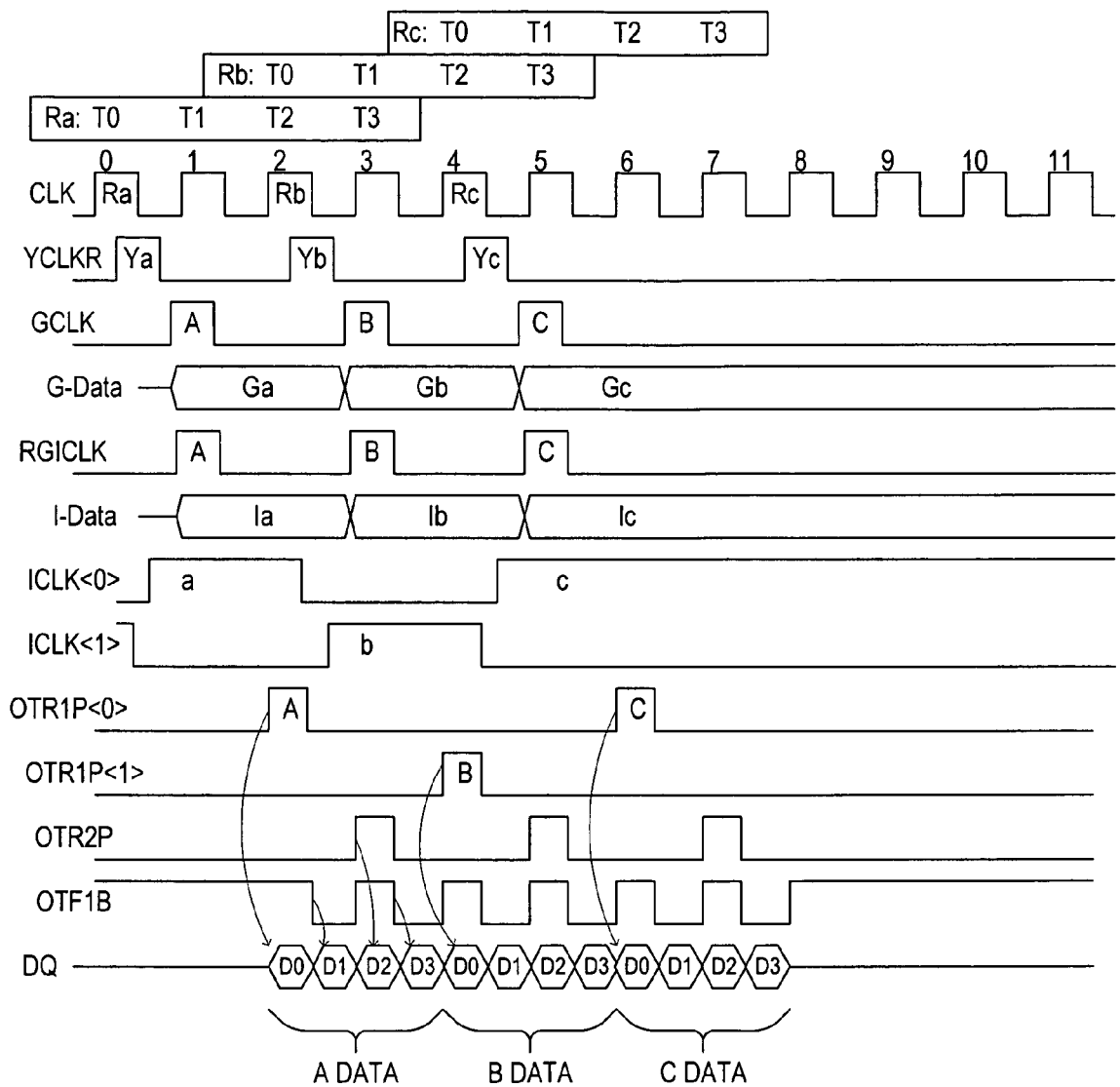
FIGS. 7–13 are memory timing diagrams according to some embodiments of the present invention.
Figure 8:
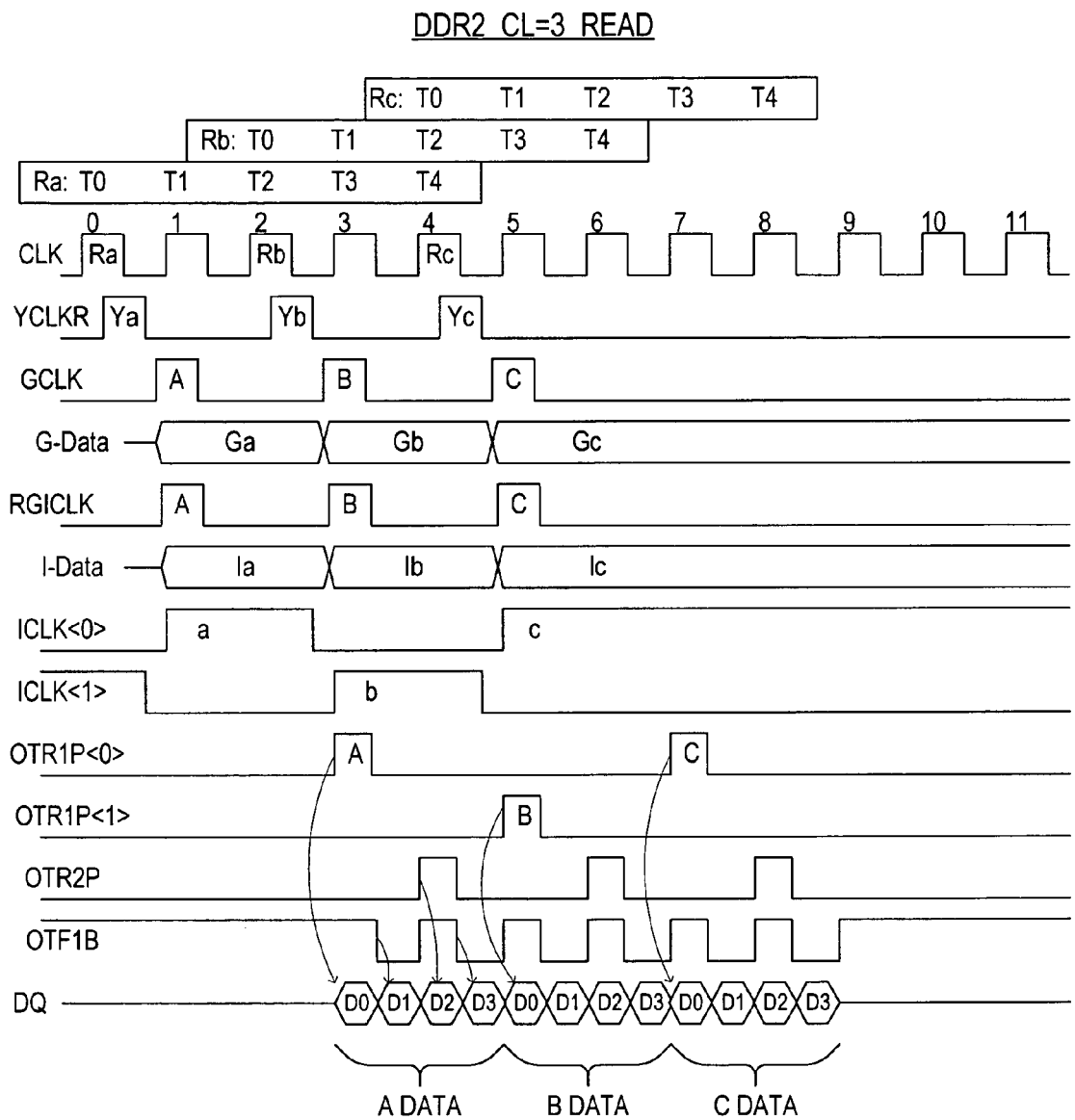
Figure 9:
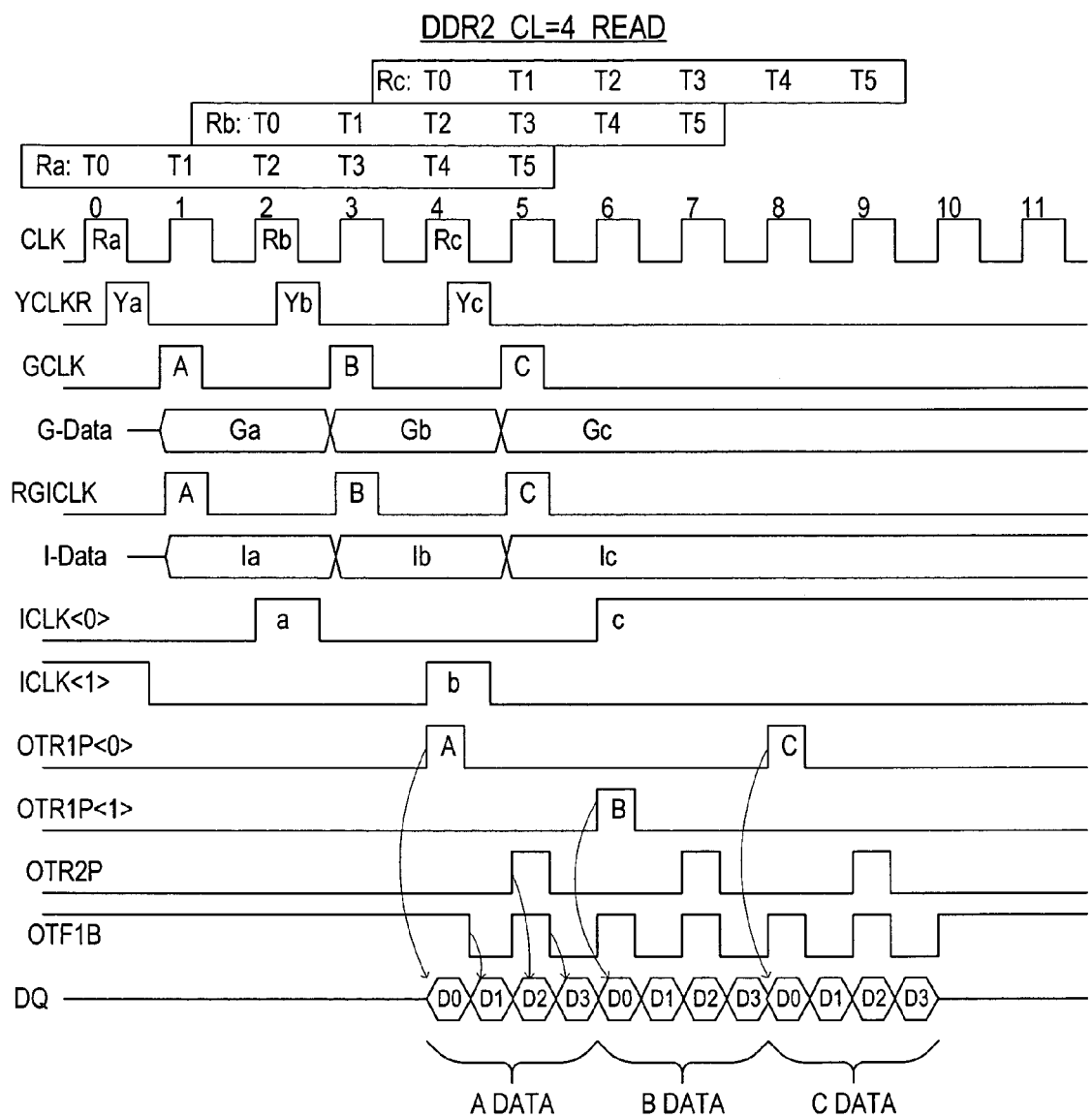
Figure 10:
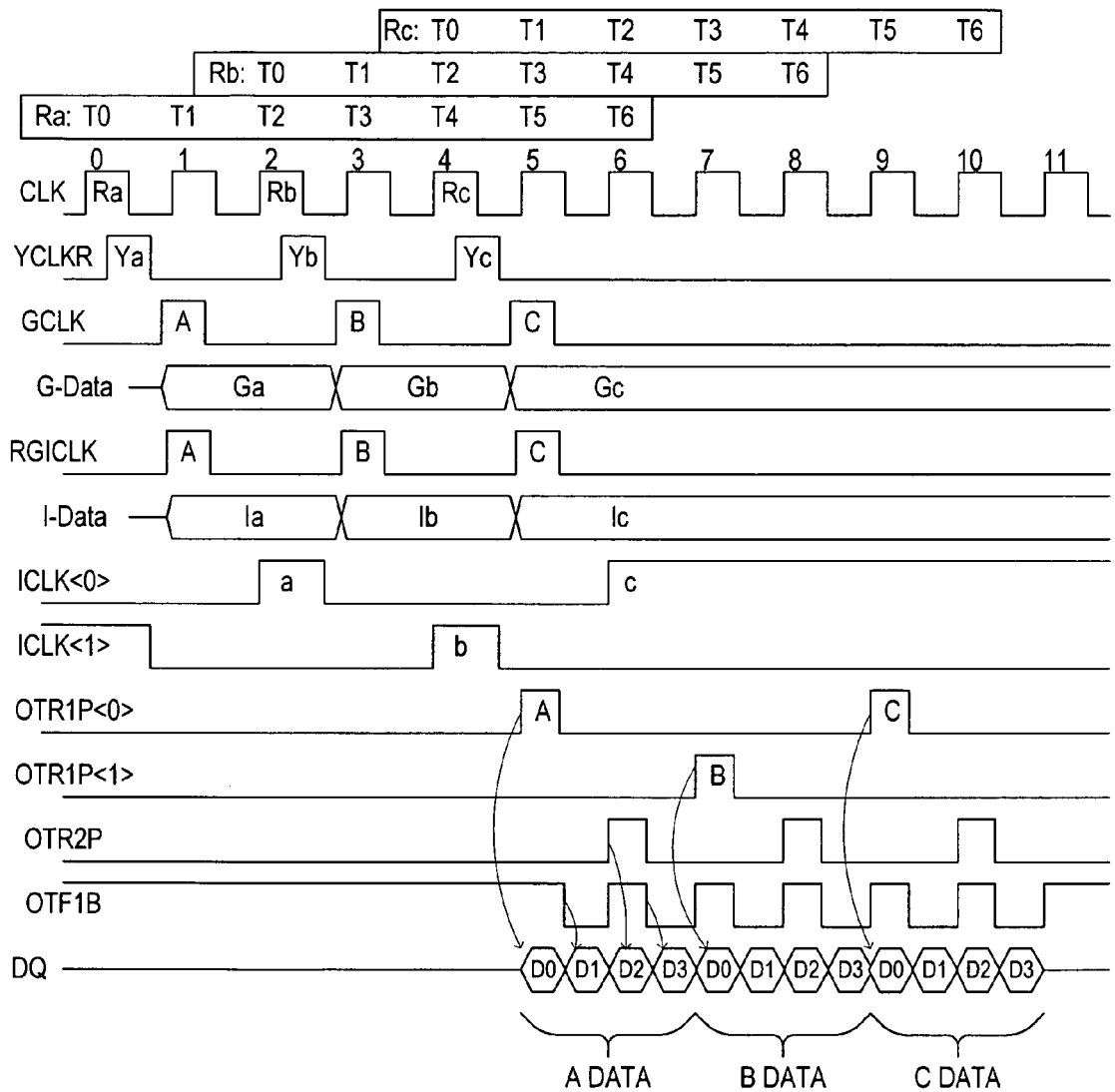

Inputs IN of bins 310.0–310.3 are connected to respective lines IR0, IF0, IR1, IF1 to receive in parallel a set of four data bits from a single prefetch operation. Inputs IN of bins 310.4–310.7 are connected to respective lines IR0, IF0, IR1, IF1 to receive in parallel a set of four data bits from the next prefetch operation. Inputs NG of bins 310.0–310.3 receive a load clock signal ICLK<0> to load the four bins with the respective four data bits. Inputs NG of bins 310.4–310.7 receive a load clock signal ICLK<1>. Signals ICLK<0>, ICLK<1> are generated by circuits shown in FIGS. 6A, 6B, 6C according to the timing diagrams of FIGS. 7–10 described in more detail below.

In circuit 320 (FIG. 5), input IN is connected to a latch formed by cross coupled inverters 510, 520. This latch provides the inverse of the signal on input IN to the input of inverter 530. The output of inverter 530 is connected to one source/drain terminal of pass gate 540. The other source/drain terminal of the pass gate is the output OUT of circuit 320. The NMOS and PMOS gates of pass gate 540 receive respective complementary signals FO, FO− which are inputs of circuit 320. Input FO− is not shown in circuits 320B, 320C in FIG. 3.

When signal FO is high, the data bit latched in circuit 320 is driven on output OUT.

Outputs OT of bins 310.0–310.3 are shown respectively as nodes ND−, NA−, NB−, NC−. (The minus sign indicates that the data bits on these nodes are in a complementary form relative to I-lines 138.) The outputs OT of bins 310.4–310.7 are connected to the same respective nodes ND−, NA−, NB−, NC−. Nodes NA−, NB−, NC− are connected to the inputs IN of respective circuits 320A, 320B, 320C. Node ND− is not connected to circuits 320 in order to shorten the data path from bins 310.0, 310.4 to output node D of P/S converter 240. The data bit on node ND− is latched by a latch formed by cross-coupled inverters 580, 584, and is inverted by inverter 590. The output of inverter 590 is the output node D.

FIGS. 6A–6G illustrate generation of the control signals ("clock signals") for P/S converter 240. Clock generator 610 receives the external clock CLK (perhaps in a cleaned-up form) and the CAS latency CL and generates the signals FICLK<1:0>, OTR1<1:0>, OTR2, and OTFB. For each of these signals, a chain of two serially connected inverters 624, 630 is provided, as shown in the respective FIGS. 6A–6G. Each of these signals is supplied to the input of the respective inverter 624, whose outputs provide the signals ICLKB<0> (the inverse of FICLK<0>, see FIG. 6B), ICLKB<1> (the inverse of FICLK<1>, see FIG. 6C), OTR1B<0> (the inverse of OTR1<0>, see FIG. 6D), OTR1B<1> (the inverse of OTR1<1> see FIG. 6E), OTR2B (the inverse of OTR2, see FIG. 6F), OTF1P (the inverse of OTFB, see FIG. 6G).

Inverters 630 have their inputs connected to the outputs of the respective inverters 624. The outputs of inverters 630 provide the respective signals ICLK<0> (logical equivalent of FICLK<0>, see FIG. 6B), ICLK<1> (logical equivalent of FICLK<1>, see FIG. 6C), OTR1P<0> (logical equivalent of OTR1<0>, see FIG. 6D), OTR1P<1> (logical equivalent of OTR1<1>, see FIG. 6E), OTR2P (logical equivalent of OTR2, see FIG. 6F), OTF1B (logical equivalent of OTFB, see FIG. 6G). In some embodiments, each of the output signals in FIGS. 6A–6G is a function of the external clock signal CLK and the CAS latency.

In some embodiments, the signals OTR1<1:0> are not functions of signals OTR2, OTR2P, OTR2B, OTFB, OTF1B, OTF1P.

FIGS. 7–10 illustrate the data output timing for the respective CAS latency values of 2, 3, 4 and 5. Three read commands Ra, Rb, Rc with a burst length of 4 are issued on the rising edges of the respective CLK cycles 0, 2, 4. Within each read command, the CLK cycles are numbered as T0, T1, T2, etc. The read command is issued on the rising edge of clock cycle T0. A clock signal YCLKR is then pulsed, as shown at Ya, Yb, Yc for the respective read commands Ra, Rb, Rc. On the falling edge of each pulse, sense amplifiers 140 (FIG. 2) are activated to amplify the prefetch data. Then a clock signal GCLK is driven high to latch the data on G-lines 134. The three GCLK pulses for the three read commands are shown respectively as A, B and C. The "G-data" diagram shows the timing of the prefetched data (denoted respectively as Ga, Gb, Gc) on G-lines 134. A clock RGICLK is driven high shortly after GCLK for each command to cause the sorting circuit 160 to drive the data onto I-lines 138. Latches are provided (not shown) to latch the data on the I-lines. The RGICLK pulses are shown as A, B and C for the respective read commands. The "I-data" diagram shows the timing of the prefetched data on I-lines 138. The prefetch data are denoted as Ia, Ib, Ic for the respective read commands Ra, Rb, Rc. The same data are denoted as D0–D3 in the DQ diagram in each of FIGS. 7–10. The lines IR0, IF0, IR1, IF1 carry the respective data bits D0, D1, D2, D3.

Clock signals YCLKR, GCLK, RGICLK are generated by circuit 290 (FIG. 2). Signals YCLKR, GCLK are provided to sense amplifiers 140, and signal RGICLK to sorting circuit 160. In some embodiments, these clock signals are not a function of the CAS latency in the DDR2 operation; i.e. their timing is the same for all the CAS latencies. The timing of sense amplifiers 140, sorting circuit 160, G-lines 134 and I-lines 138 is the same for all CAS latencies.

Then ICLK<0> is driven high to load the data into bins 310.0–310.3. It is assumed that the previous prefetch data was loaded into bins 310.4–310.7. These two groups of bins alternate for successive prefetch operations. If the previous data was loaded into bins 310.0–310.3, the current data will be loaded into bins 310.4–310.7. The read operations are similar for both cases. As shown in FIGS. 7–10, ICLK<0> is asserted as a result of T0.5 (the falling edge of T0) for CL=2, as a result of the rising edge of T1 for CL=3, and as a result of the rising edge of T2 for the CL values of 4 and 5. ICLK<0> is delayed for the larger CAS values to avoid overwriting the data prefetched two prefetch operations earlier.

After ICLK<0> becomes high, signal OTR1P<0> is driven high. This signal is delivered to the OTR inputs of bins 310.0–310.3. When this input becomes high, the data bits D0, D1, D2, D3 stored in the bins are driven in parallel to the respective nodes ND−, NA−, NB−, NC−. The data bit D0 on node ND− is provided immediately to output D of P/S converter 240, and is immediately driven to terminal DQ by buffer 250 (FIG. 2) on the rising edge of the appropriate clock cycle 2, 3, 4, or 5 depending on the CAS latency (see also FIG. 1).

The timing diagrams are given for the DLL-enabled operation as specified in the DDR2 standard. The DLL (delay locked loop, not shown) is used in the DDR and DDR2 memories to align the DQ transitions with the CLK edges. According to the DDR and DDR2 standards, the DLL must be enabled in the normal operation, but may be disabled for testing. In some embodiments, for CL=2, the DQ transitions occur slightly before T2 (at T2−Δt where Δt is a small time interval) to ensure that the data is valid on the rising edge of T2. Likewise, for CL=3, 4, and 5, the DQ transitions occur slightly before T3, T4 or T5 respectively. If the DLL is disabled, the DQ transitions occur as a result of the rising edge of the corresponding CLK cycle (T2, T3, T4, or T5 for the respective CAS latency of 2, 3, 4 or 5), or one cycle earlier (e.g. at the rising edge of T1, T2, T3, or T4 respectively).

The data bits D1, D2, D3 are latched by respective circuits 320A, 320B, 320C. The FO input of circuit 320A receives the signal OTF1B, and the FO inputs of circuits 320B, 320C receive the signal OTR2P. OTR1P<0> is driven low to isolate the nodes ND−, NA−, NB−, NC− from bins 310.0–310.3, and OTF1B is asserted low to cause circuit 320A to drive D1 onto ND−. From ND−, the bit D1 is transferred immediately to node D and from node D immediately to terminal DQ. This happens on the falling edge of CLK cycle 2, 3, 4 or 5 depending on the CAS latency.

OTF1B becomes high to isolate node ND− from circuit 320A, and OTR2P<0> is asserted high to cause the circuits 320B, 320C to drive their respective bits D2, D3 onto the respective nodes ND−, NA−. D2 is immediately transferred to node D and then immediately to DQ, and D3 is latched by circuit 320A. Then OTR2P becomes low to isolate the nodes ND−, NA− from the respective circuits 320B, 320C. OTF1B is driven low to cause the circuit 320A to drive the bit D3 to node ND−. Bit D3 is immediately transferred to node D and then immediately to terminal DQ.

As a result of the rising edge of CLK cycle 2 and command Rb, signal ICLK<0> is driven low to isolate the I-lines from bins 310.0–310.3. ICLK1<1> is driven high to load the bins 310.4–310.7 with the Ib data D0–D3 on the I-lines. The ICLK<1> timing for the Rb command is the same as the ICLK<0> timing for the Ra and Rc commands.

After ICLK<1> became high, signal OTR1P<1> is driven high. This signal is delivered to the OTR inputs of bins 310.4–310.7. The OTR1P<1> timing for the Rb command is the same as the OTR1P<0> timing for the Ra command. When OTR1P<1> becomes high, the data bits D0, D1, D2, D3 stored in bins 310.4–310.7 are driven in parallel to the respective nodes ND−, NA−, NB−, NC−. Then the read proceeds as in the Ra case. The Rc read is performed with the same timing as the Ra read.

If the burst length is 8, then the operations shown for Ra and Rb are combined and performed for the Ra read.

As noted above, the ICLK<0> and ICLK<1> assertion is delayed for CL=4 and CL=5 to avoid overwriting the previous prefetched data. In other embodiments, the prefetch operation is slower (due to a slower circuitry), and/or is delayed (due to a delayed timing of the clocks YCLKR, GCLK and RGICLK). In this cases, the ICLK<0> and ICLK<1> signals are not delayed for CL=4, and these signals may also not be delayed for CL=5. In other embodiments, the prefetch is faster, and the two ICLK signals are delayed even for the CAS latencies below 4.

The clock signals can be generated by circuits 290 (FIG. 2) and 610 (FIGS. 6A–6G) using known techniques. In some embodiments, to ensure that the data is available on the rising CLK edge as specified in the DDR2 standard, the clock signals OTR1<1:0>, OTR2, and OTF1 (and their compliments) are DLL compensated when the DLL is enabled. The DLL compensation means that these signals are asserted or deasserted a certain time Δt prior to the corresponding CLK edge at which the data must be available on the DQ terminal. The DLL is enabled in the DDR and DDR2 memories by setting appropriate bits in the extended mode register, as specified by the DDR and DDR2 standards cited above. See also U.S. Pat. No. 6,285,216 issued Sep. 4, 2001 to Faue et al., incorporated herein by reference.

Figure 11:
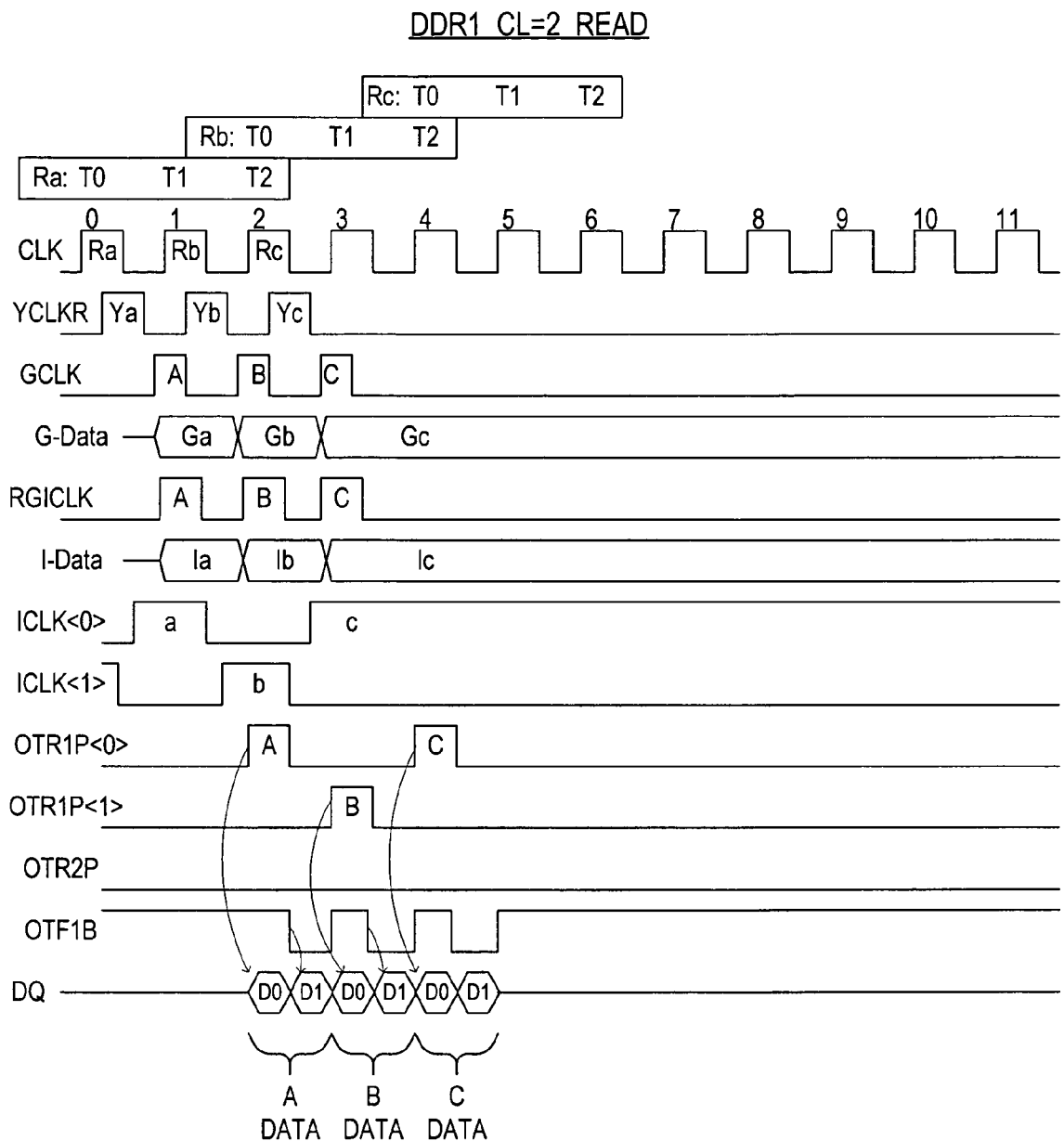
Figure 12:
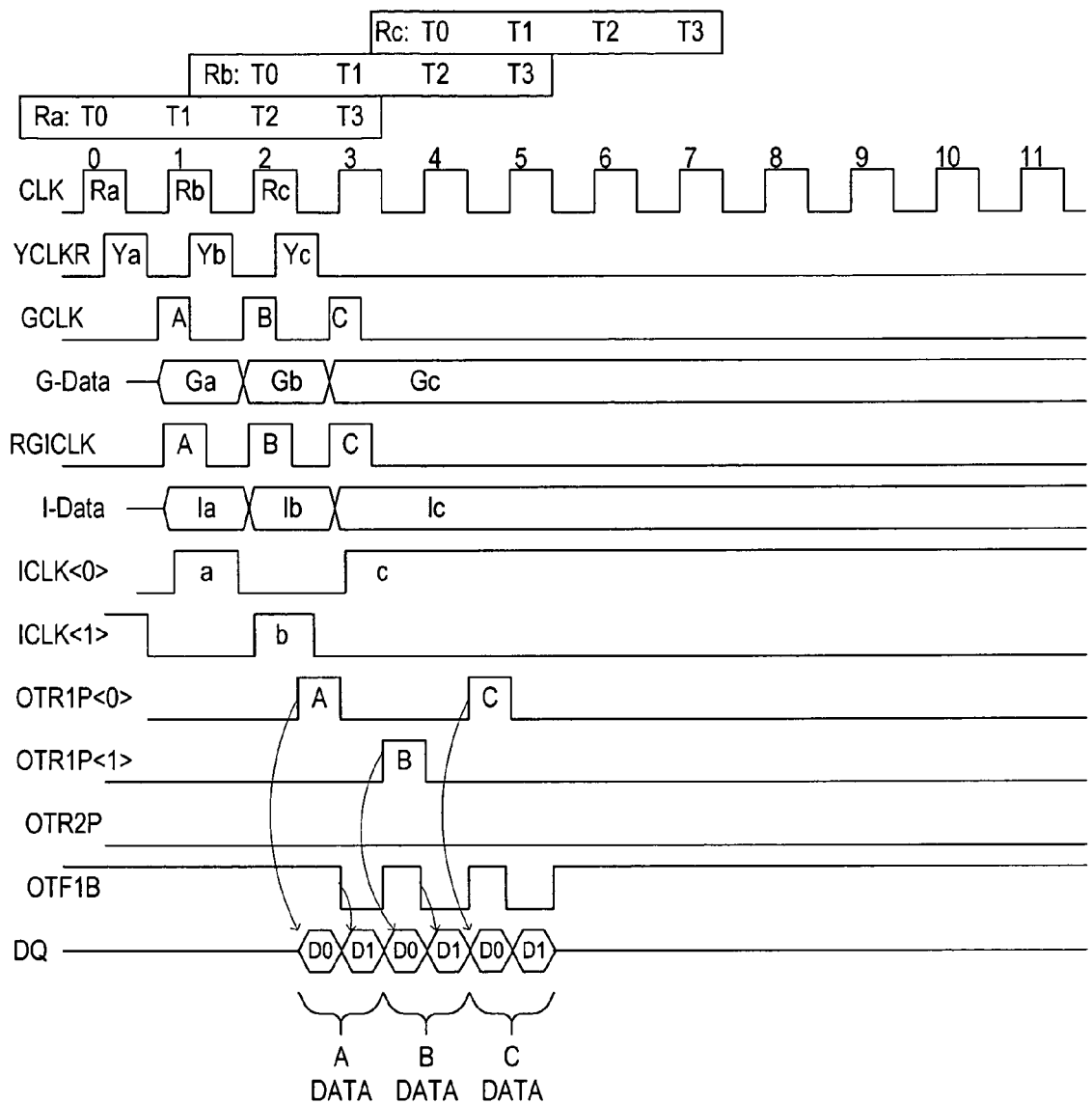
Figure 13:
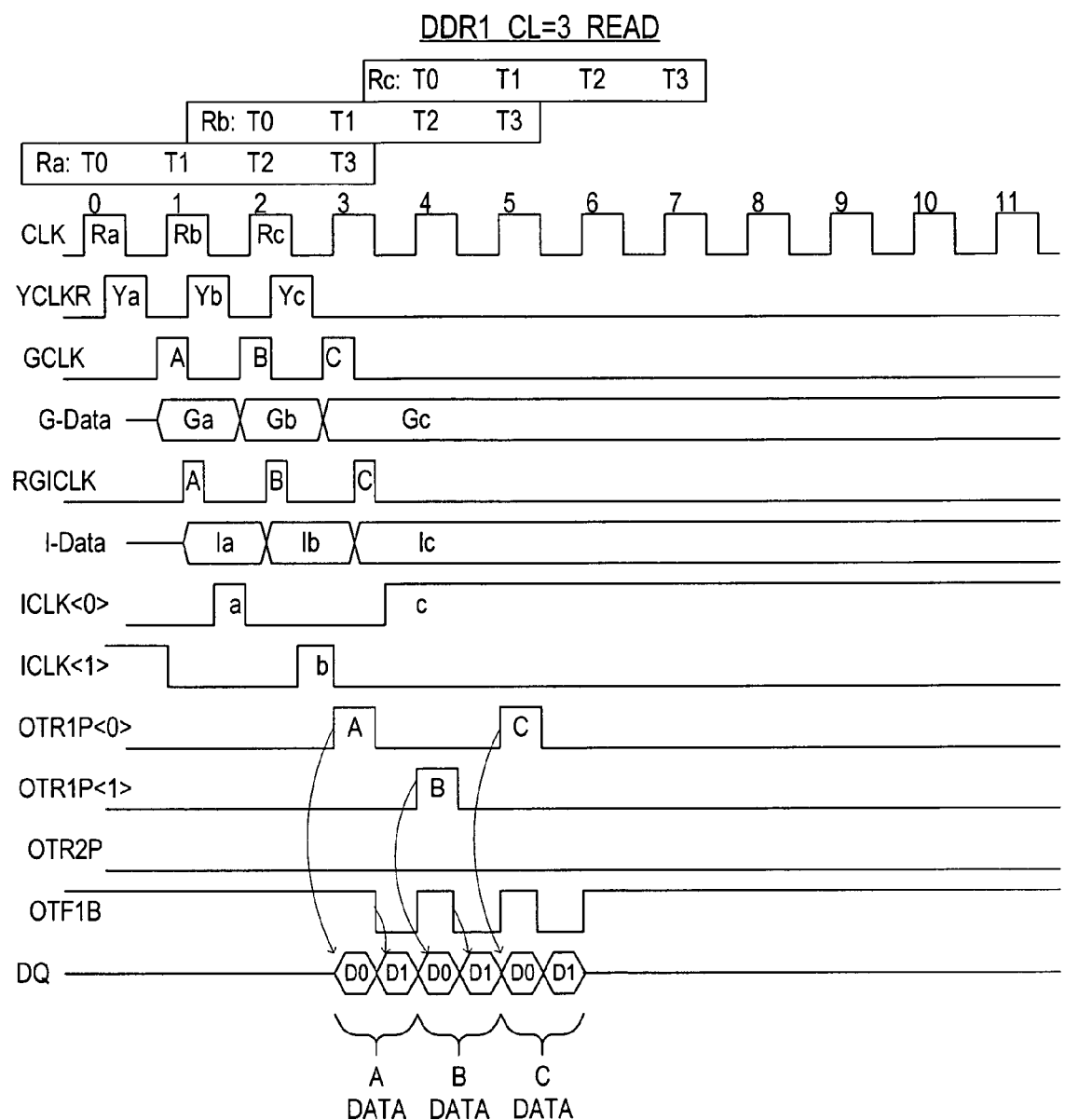

The memory also provides the DDR functionality, with a prefetch of two data items. The DDR timing diagrams for the CAS latencies of 2, 2.5 and 3 and the burst length of 2 are shown respectively in FIGS. 11, 12 and 13. In each figure, read commands Ra, Rb, Rc are issued on the rising edges of the respective CLK cycles 0, 1, 2. The timing of signals YCLKR, GCLK, G-data for each read command is as in the DDR2 operation, and is independent of the CAS latency. The signals RGICLK, I-data are delayed for CL=3 to allow slow frequency operation of the circuits 310, 320. RGICLK is asserted as a result of the rising edge of T1 for CL=3, and as a result of the rising edge of T0 (more particularly, of the falling edge of YCLKR) for all the other DDR CAS latencies and for all of the DDR2 CAS latencies. The I-data signals transition when RGICLK is asserted. In the DDR operation, only two data bits are prefetched to two of G-lines 134, and are driven on I-lines IR0, IF0 as the I-data. Signal OTR2 (FIG. 6A), and hence OTR2P, is permanently at ground, and hence the circuits 320B, 320C are disabled. Tying OTR2 to ground can be accomplished with a metal option, an electrically or laser programmable fuse, an electrically programmable cell such as EEPROM, or in some other way, known or to be invented.

The ICLK signals (ICLK<0> or ICLK<1>) are asserted as a result of T0.5 (the falling edge of T0) for CL=2, the rising edge of T1 for CL=2.5, and the falling edge of T1 for CL=3. The OTR1P timing (OTR1P<0> or OTR1P<1>) is also as in the DDR2 operation. The data bit D0 is provided to the D output on the rising edge of OTR1P<0> or OTR1P<1>, depending on whether the data was latched in bins 310.0, 310.1 or in bins 310.4, 310.5. The data bit D1 is provided to the D output on the falling edge of OTF1B.

For the burst length of 4 or 8, the operation is similar. Each pair of data bits D<0:1>, D<2:3>, D<4:5>, D<6:7> is loaded into a different pair of bins, i.e. in bins 310.0, 310.1 or bins 310.4, 310.5, on the rising edge of ICLK<0> or ICLK<1>. The two bits are driven onto the respective nodes ND−, NA− on the rising edge of OTR1P<0> or OTR1P<1>. The second of the two bits is driven onto the node ND− on the falling edge of OTF1B.

Figure 14:
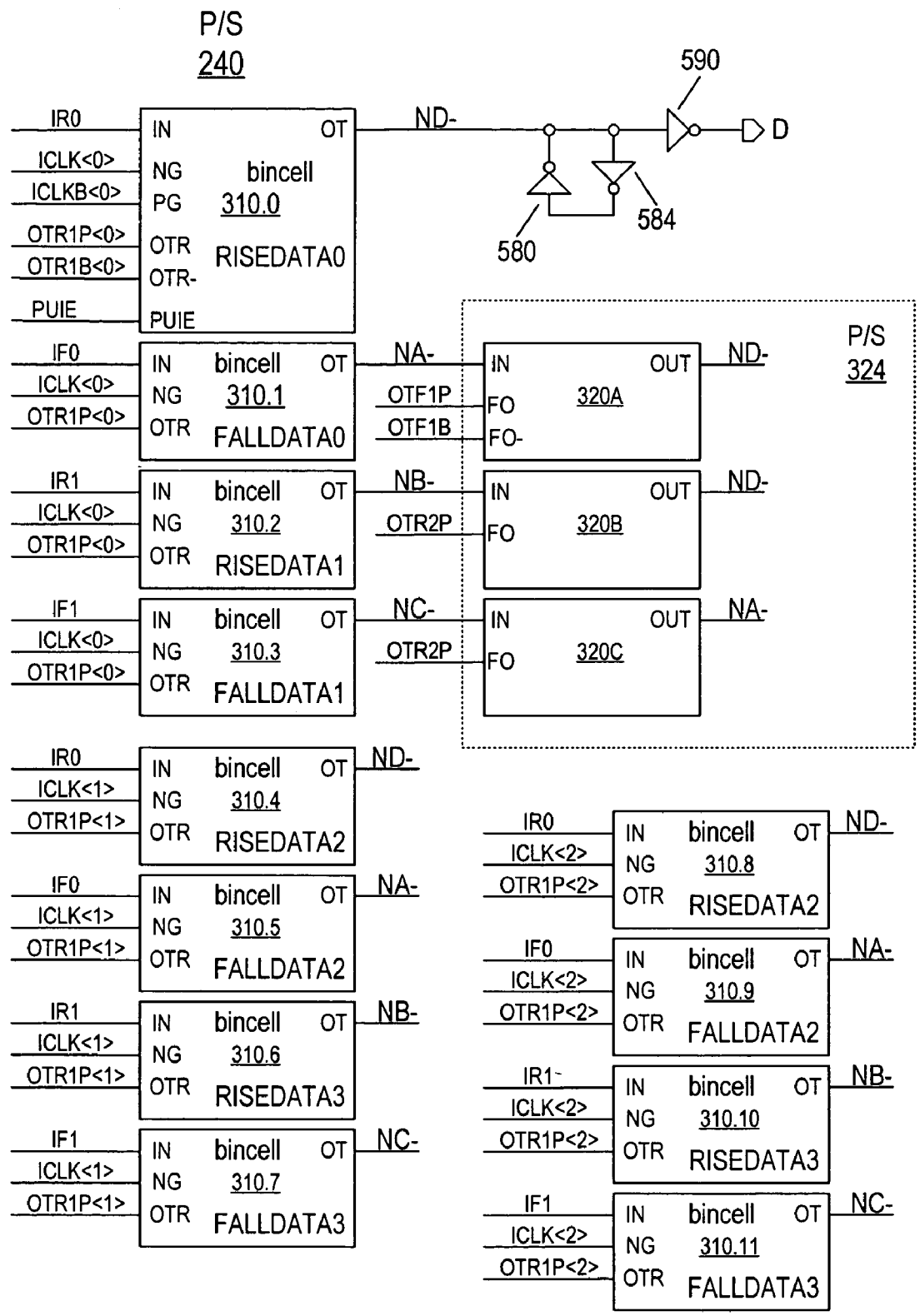
FIG. 14 is a block-circuit diagram of a memory circuit according to some embodiments of the present invention.

In some slow prefetch embodiments, the bins 310.4–310.7 can be omitted because the read data are output from bins 310.0–310.3 by the time the new prefetch data are loaded into the bins. In other embodiments, on the contrary, additional bins are provided to enable the new prefetched data to be loaded while the bins 310 still hold the data from two or more previous prefetch operations. In FIG. 14, for example, additional bins 310.8–310.11 are provided. This group of bins is identical to bins 310.0–310.3 except that the NG inputs of bins 310.8–310.11 receive a load signal ICLK<2>, and the OTR inputs receive a signal OTR1P<2>. The timing of signals ICLK<2>, OTR1P<2> is similar to the timing of the respective signals <ICLK<0>, OTR1P<0>.

Figure 15:
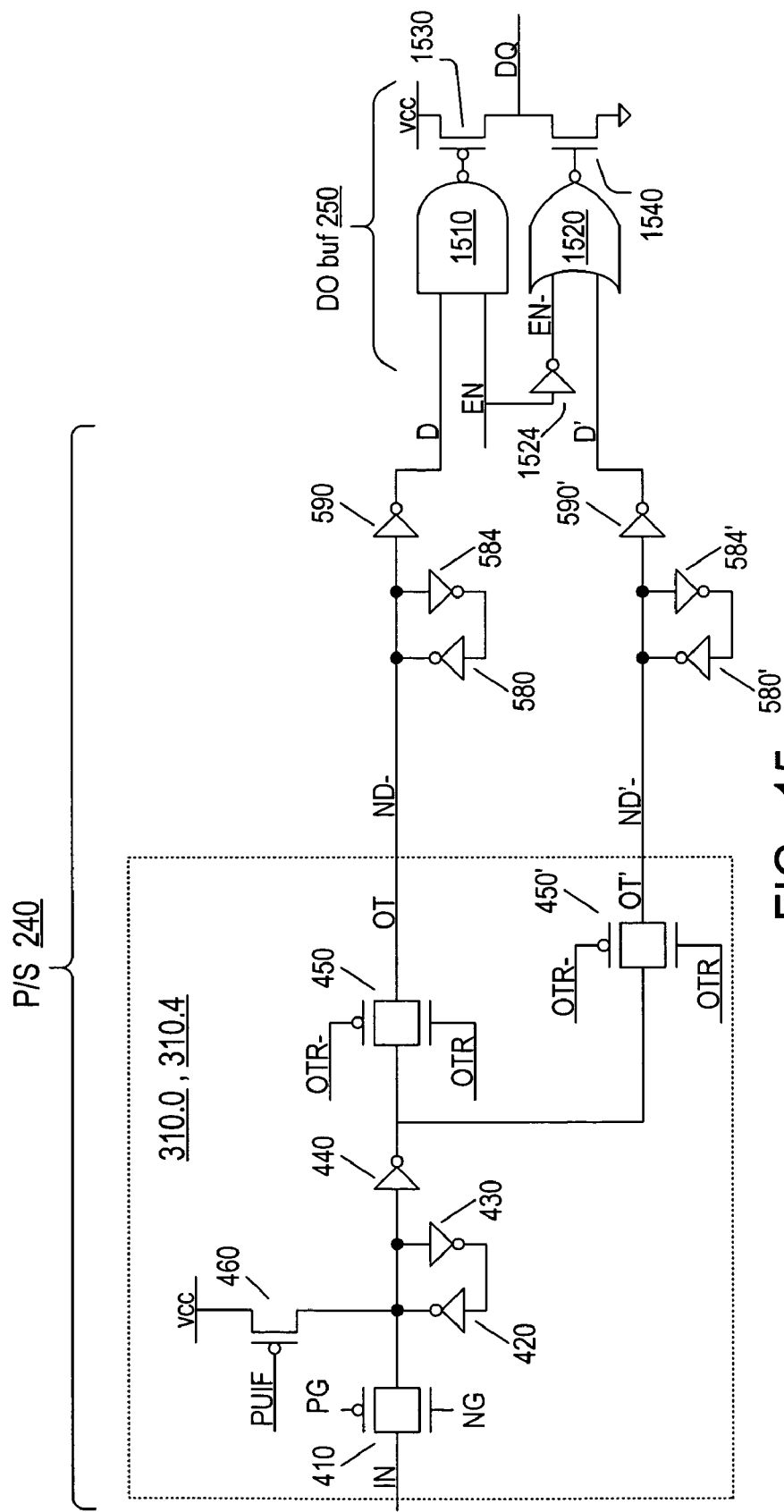
FIGS. 15, 16 are circuit diagrams of memory circuits according to some embodiments of the present invention.

The invention is not limited to any particular circuitry. For example, the output OUT of circuit 320A (FIG. 3) can be connected to node D rather than D–, and inverter 530 can be omitted. In FIG. 15, the bins 310.0, 310.4 are modified to provide an additional output OT' for DO buffer 250 (FIG. 2). The output of inverter 440 in each of these bins is connected to one source/drain terminal of pass gate 450' identical to pass gate 450, controlled by the same signals OTR (NMOS gate) and OTR– (PMOS gate) as the pass gate 450. The other source/drain terminal of pass gate 450' is the output OT'. The signal on output OT' is identical to the signal on output OT. Outputs OT' of bins 310.0, 310.4 are connected to a common node ND'–. Node ND'– is connected to a circuit consisting of inverters 580', 584', 590'. This circuit is identical to the circuit of inverters 580, 584, 590, and the output OT' is connected to the input of inverter 590'. The output of inverter 590' is marked D'. This node provides a signal logically identical to the signal on node D.

Node D is connected to one input of two-input NAND 1510 in buffer 250. The other inputs of NAND gate 1510 receives an output enable signal EN. EN is high during reads, and low during writes to disable the buffer 250. Node D' is connected to one input of two-input NOR gate 1520. The other input of NOR gate 1520 receives the signal EN-obtained by inverting EN with inverter 1524. The outputs of gates 1510, 1520 are connected respectively to the gates of PMOS transistor 1530 and NMOS transistor 1540. PMOS transistor 1530 has its source connected to voltage source VCC and its drain connected to terminal DQ. NMOS transistor 1540 has its drain connected to terminal DQ and its source connected to ground (or some other reference voltage). The buffer 250 diagram is simplified. Output buffers 250 providing full DDR and DDR2 functionality are known in the art.

Figure 16:
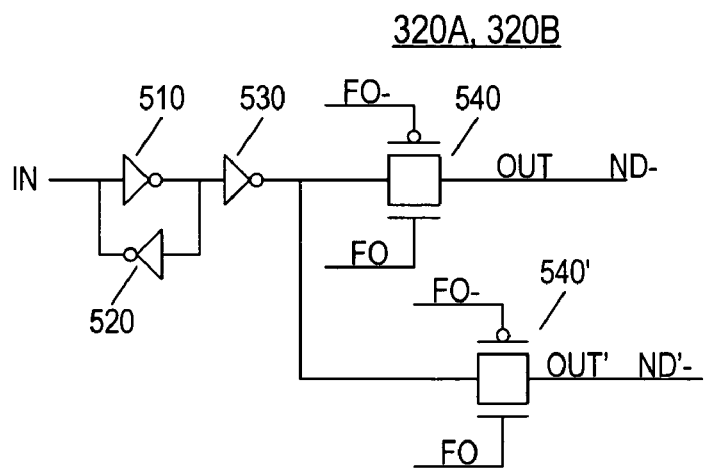

Circuits 320A, 320B (FIG. 3) can also be modified to provide an additional output OUT' for DO buffer 250 (FIG. 2). See FIG. 16. The output of inverter 530 in each of bins 320A, 320B is connected to one source/drain terminal of pass gate 540' identical to pass gate 540, controlled by the same signals FO (NMOS gate) and FO– (PMOS gate) as the pass gate 540. The other source/drain terminal of pass gate 540' is the output OUT'. The signal on output OUT' is identical to the signal on output OUT. Outputs OUT' of circuits 320A, 320B are connected to node ND'– (FIG. 15).

Figure 17:
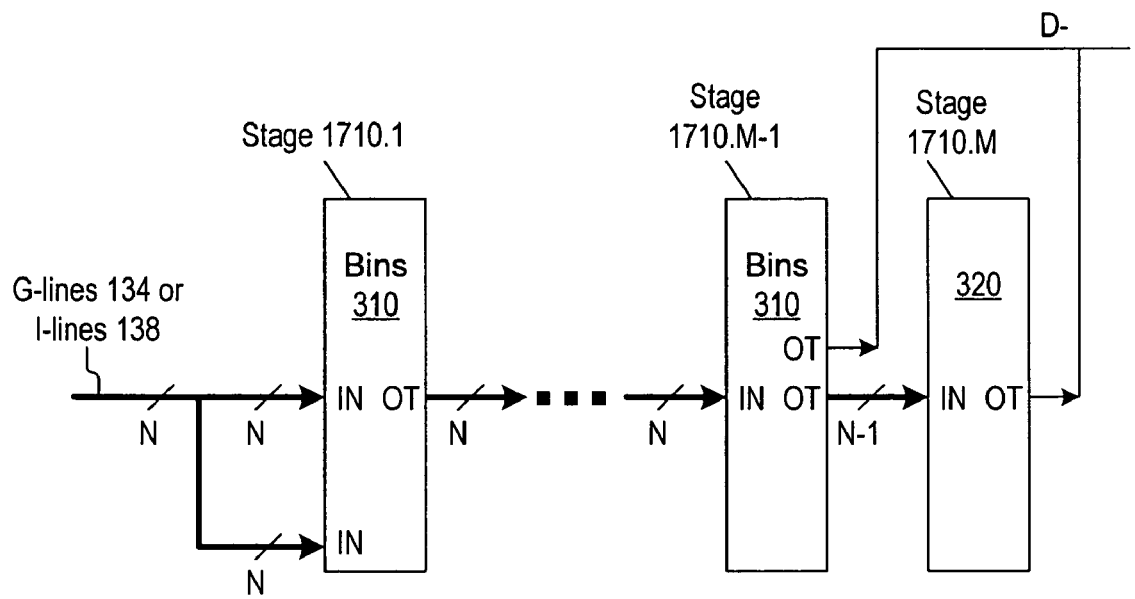
FIG. 17 is a block diagram of a memory circuit according to some embodiments of the present invention.

In some embodiments, more than two stages of latches are provided in the output data path. In FIG. 17, a number M of stages 1710.1, . . . 1710.M are provided, where M can be any integer greater than 1. The invention is not limited to a prefetch of 4 data items, and FIG. 17 shows a prefetch of N data items in parallel, where N can be 4 as in FIGS. 2 and 3, or can be 8, 16, or any number greater than 2. The first stage 1710.1 may have its inputs connected to I-lines 138 as in FIG. 3, but in some embodiments stage 1710.1 receives data directly from G-lines 134. The data can be sorted as it is transferred from each stage 1710.i to the next stage, as described in U.S. patent application No. 2002/0149960 A1 published on Oct. 17, 2002, incorporated herein by reference. If the sorting is performed as in U.S. patent application No. 2002/0149960 A1, then sorting circuit 160 is unnecessary. As to the embodiment of FIGS. 2 and 3, the sorting circuit can be viewed as the first stage 1710.1.

The first M–1 stages 1710.1, . . . 1710.M–1 each contain a number of bins 310 as in FIG. 3. Stage 1710.1 contains 2×N bins 310 to latch two prefetched sets of N data bits each. Stage 1710.1 may have additional bins to hold more prefetched sets (see FIG. 14). If M>2, the subsequent stages 1710.2, . . . 1710.M–1 may each have bins to hold one or more prefetched sets, not necessarily the same number of bins as stage 1710.1. Each stage 1710.i (i<M) has at least N outputs OT for providing each set in parallel. Each stage 1710.i (i<i<M) receives the N data bits of each set in parallel on its inputs IN from the previous stage.

Stage 1710.M–1 provides the first data bit D0 of each set to node D–, and in parallel provides the remaining data bits to stage 1710.M. Stage 1710.M has at least N–1 circuits 320. Stage 1710.M serially provides the remaining data bits to node D– (or some other node coupled to the DQ terminal). The clock signals controlling the driving of the first data bit to node D– are not functions of any clock signals controlling the driving of the remaining data bits from stage 1710.M to node D–.

The invention is not limited to the embodiments described above. The invention is not limited to the DDR or DDR2 memories. The memory can be a single data rate memory, or a memory with one data item read out per one clock cycle, per two clock cycles, or per any number of clock cycles. The invention is not limited to CMOS or any particular circuitry. The invention is not limited to memories with G-lines and I-lines arranged as in FIG. 2, or to a particular data sorting circuitry. Another suitable example of a data sorting circuitry is shown in U.S. patent application No. 2002/0149960 A1 published on Oct. 17, 2002, and other data sorting methods and circuits, known or to be invented, can also be suitable. The invention is not limited to a particular type of a memory cell. The invention is applicable to DRAM (pseudo-SRAM) cells disclosed in U.S. Pat. No. 6,285,578 issued Sep. 4, 2001 to Huang and incorporated herein by reference, and to other DRAM and non-DRAM memory cells, known or to be invented. Other embodiments and variations are within the scope of the invention, as defined by the appended claims.

ADDENDUM

TABLE 1

DDR BURST OPERATIONS

| Burst Length | Starting CL Address | Data Sequence (i.e. Address Sequence) within the Burst | |
|---|---|---|---|
| | | Interleaved | Sequential |
| | A0 | | |
| 2 | 0 | 0-1 | 0-1 |
| | 1 | 1-0 | 1-0 |
| | A1 A0 | | |
| 4 | 00 | 0-1-2-3 | 0-1-2-3 |
| | 01 | 1-0-3-2 | 1-2-3-0 |
| | 10 | 2-3-0-1 | 2-3-0-1 |
| | 11 | 3-2-1-0 | 3-0-1-2 |

TABLE 1-continued

DDR BURST OPERATIONS

| Burst Length | Starting CL Address | Data Sequence (i.e. Address Sequence) within the Burst | |
|---|---|---|---|
| | | Interleaved | Sequential |
| | A2 A1 A0 | | |
| 8 | 000 | 0-1-2-3-4-5-6-7 | 0-1-2-3-4-5-6-7 |
| | 001 | 1-0-3-2-5-4-7-6 | 1-2-3-4-5-6-7-0 |
| | 010 | 2-3-0-1-6-7-4-5 | 2-3-4-5-6-7-0-1 |
| | 011 | 3-2-1-0-7-6-5-4 | 3-4-5-6-7-0-1-2 |
| | 100 | 4-5-6-7-0-1-2-3 | 4-5-6-7-0-1-2-3 |
| | 101 | 5-4-7-6-1-0-3-2 | 5-6-7-0-1-2-3-4 |
| | 110 | 6-7-4-5-2-3-0-1 | 6-7-0-1-2-3-4-5 |
| | 111 | 7-6-5-4-3-2-1-0 | 7-0-1-2-3-4-5-6 |

Here A2, A1, A0 are the three least significant bits (LSB) of a burst operation's "starting address" An . . . A2A1A0 (or A<n:0>). For each burst length (2, 4, or 8), and each starting address, the DDR standard defines a sequential type ordering and an interleaved type ordering. The burst length and type are written to memory mode register 144 before the burst begins. The data are read from, or written to, a block of 2, 4, or 8 memory locations. The block address is defined by the most significant address bits (bits A<n:3> for burst length of 8, bits A<n:2> for burst length of 4, bits A<n:1> for burst length of 2). The least significant address bits and the burst type define the data ordering within the block. For example, for the burst length of 4, the starting address A<n:0>= x . . . x01, and the interleaved type, the data are read or written at a block of four memory locations at addresses x . . . x00 through x . . . x11 in the order 1-0-3-2 (Table 1), i.e. the first data item is written to address x . . . x01, the second data item to address x . . . x00, the third data item to address x . . . x11, and the fourth data item to address x . . . x10 (the data ordering is the order of the address LSB's).

TABLE 2

DDR2 BURST OPERATIONS

| Burst Length | Starting CL Address | Data Sequence within the Burst | |
|---|---|---|---|
| | | Interleaved | Sequential |
| | A1 A0 | | |
| 4 | 00 | 0-1-2-3 | 0-1-2-3 |
| | 01 | 1-0-3-2 | 1-2-3-0 |
| | 10 | 2-3-0-1 | 2-3-0-1 |
| | 11 | 3-2-1-0 | 3-0-1-2 |
| | A2 A1 A0 | | |
| 8 | 000 | 0-1-2-3-4-5-6-7 | 0-1-2-3-4-5-6-7 |
| | 001 | 1-0-3-2-5-4-7-6 | 1-2-3-0-5-6-7-4 |
| | 010 | 2-3-0-1-6-7-4-5 | 2-3-0-1-6-7-4-5 |
| | 011 | 3-2-1-0-7-6-5-4 | 3-0-1-2-7-4-5-6 |
| | 100 | 4-5-6-7-0-1-2-3 | 4-5-6-7-0-1-2-3 |
| | 101 | 5-4-7-6-1-0-3-2 | 5-6-7-4-1-2-3-0 |
| | 110 | 6-7-4-5-2-3-0-1 | 6-7-4-5-2-3-0-1 |
| | 111 | 7-6-5-4-3-2-1-0 | 7-4-5-6-3-0-1-2 |

The invention claimed is:

1. A memory circuit comprising:
(1) a node for serially providing data read out of memory cells;
(2) circuitry comprising M stages $S_1, \ldots S_M$, where M>1, for holding sets of N data bits $(D_0, D_1, \ldots D_{N-1})$ read out of memory cells before serially providing the data bits to said node in the order $D_0, D_1, \ldots, D_{N-1}$, where $N \geq 2$, wherein each set of N data bits is read out of the memory cells in parallel, wherein each stage $S_i$ (i<M) has at least N outputs for providing each set in parallel;
(3) a clock signal generator for generating one or more first clock signals and one or more second clock signals, wherein:
the stage $S_{M-1}$ is responsive to one or more of the first clock signals to provide the data bit $D_0$ of each set to said node;
wherein the stage $S_M$ is responsive to the one or more second clock signals for serially providing the bits $D_1, \ldots D_{N-1}$ to said node;
wherein the one or more first clock signals are not a function of any second clock signal.

2. The memory circuit of claim 1 wherein each stage $S_i$ (i<M) is responsive to one or more of the first clock signals to provide the N data bits of each set in parallel on the stage's outputs.

3. The memory circuit of claim 1 wherein each stage $S_i$ (i<M) has at least N inputs for receiving each set in parallel, wherein the stage $S_M$ is to receive in parallel N−1 bits of each set but is not to receive the bit $D_0$.

4. The memory circuit of claim 1 wherein each stage $S_i$ (i>1) is to receive the bits of each set from the stage $S_{i-1}$.

5. The memory circuit of claim 1 wherein $N \geq 4$.

6. The memory circuit of claim 1 further comprising a circuit for specifying a variable latency between receipt of a read command by the memory and a serial output of read data by the memory, wherein at least one of the first clock signals and at least one of the second clock signals are functions of the latency.

7. The memory circuit of claim 1 wherein the stage $S_1$ comprises storage to hold at least two sets of N data bits, each set being read out of the memory cells in parallel, the two sets being read out of the memory cells at different times not in parallel with each other.

8. The memory circuit of claim 1 further comprising N lines $L_0, L_1, \ldots L_{N-1}$ for carrying the N data bits of each set in parallel to the stage $S_1$, each line $L_i$ (i=0, . . . , N−1) carrying the respective data bit $D_i$ of the set.

9. The memory circuit of claim 1 further comprising:
N lines $L_0, L_1, \ldots L_{N-1}$ for carrying the N data bits of each set in parallel to the stage $S_1$;
circuitry for specifying an order in which the bits on the lines $L_0, L_1, \ldots L_{N-1}$ are to be provided on said node;
wherein the stages comprise circuitry for ordering the bits in said order.

10. A method for reading data from a memory, the method comprising:
(1) reading a set of N data bits $(D_0, D_1, \ldots D_{N-1})$ from memory cells in parallel, and loading the set of bits in parallel into a stage $S_{M-1}$, where $N \geq 2$;
(2) transferring the data bits $(D_0, D_1, \ldots D_{N-1})$ in parallel responsively to one or more first clock signals from the stage $S_{M-1}$, with the bit $D_0$ being transferred to a node for serially providing the data bits, and with the bits $(D_1, \ldots D_{N-1})$ being transferred to a stage $S_M$;
(3) after the operation (2), serially transferring the data bits $(D_1, \ldots D_{N-1})$ from the stage $S_M$ to the node responsively to one or more second clock signals;
wherein the one or more first clock signals are not a function of any second clock signal.

11. The method of claim 10 further comprising specifying a variable latency between receipt of a read command by the memory and a serial output of the data bits ($D_0, D_1, \ldots D_{N-1}$) by the memory, wherein at least one of the first clock signals and at least one of the second clock signals are functions of the latency.

12. The method of claim 11 wherein $N \geq 4$.

13. A memory circuit comprising:
(1) an input/output terminal;
(2) circuitry comprising M stages $S_1, \ldots S_M$, where $M>1$, for holding sets of N data bits ($D_0, D_1, \ldots D_{N-1}$) read out of memory cells before serially providing the data bits to said terminal in the order $D_0, D_1, \ldots, D_{N-1}$, where $N \geq 2$, wherein each set of N data bits is read out of the memory cells in parallel, wherein each stage $S_i$ (i<M) has at least N outputs for providing each set in parallel;
(3) a clock signal generator for generating one or more first clock signals and one or more second clock signals, wherein:
the stage $S_{M-1}$ is responsive to one or more of the first clock signals to provide the data bit $D_0$ of each set to said terminal;
wherein the stage $S_M$ is responsive to the one or more second clock signals for serially providing the bits $D_1, \ldots D_{N-1}$ to said terminal.

14. The memory circuit of claim 13 wherein each stage $S_i$ (i<M) is responsive to one or more of the first clock signals to provide the N data bits of each set in parallel on the stage's outputs, wherein the stage $S_{M-1}$ is responsive to one or more of the first clock signals to provide the data bit $D_0$ of each set to said terminal.

15. The memory circuit of claim 13 wherein each stage $S_i$ (i<M) has at least N inputs for receiving each set in parallel, wherein the stage $S_M$ is to receive in parallel N−1 bits of each set but is not to receive the bit $D_0$.

16. The memory circuit of claim 13 wherein each stage $S_i$ (i>1) is to receive the bits of each set from the stage $S_{i-1}$.

17. The memory circuit of claim 13 wherein $N \geq 4$.

18. The memory circuit of claim 13 further comprising a circuit for specifying a variable latency between receipt of a read command by the memory and a serial output of read data by the memory, wherein at least one of the first clock signals and at least one of the second clock signals are functions of the latency.

19. The memory circuit of claim 13 wherein the stage $S_1$ comprises storage to hold at least two sets of N data bits, each set being read out of the memory cells in parallel, the two sets being read out of the memory cells at different times not in parallel with each other.

20. The memory circuit of claim 13 further comprising N lines $L_0, L_1, \ldots L_{N-1}$ for carrying the N data bits of each set in parallel to the stage $S_1$, each line $L_i$ (i=0, ..., N−1) carrying the respective data bit $D_i$ of the set.

21. The memory circuit of claim 13 further comprising:
N lines $L_0, L_1, \ldots L_{N-1}$ for carrying the N data bits of each set in parallel to the stage $S_1$;
circuitry for specifying an order in which the bits on the lines $L_0, L_1, \ldots L_{N-1}$ are to be provided on said terminal;
wherein the stages comprise circuitry for ordering the bits in said order.

* * * * *